(12) United States Patent
Fujikawa

(10) Patent No.: US 6,598,217 B1
(45) Date of Patent: Jul. 22, 2003

(54) METHOD OF MOUNTING FABRICATION-HISTORICAL DATA FOR SEMICONDUCTOR DEVICE, AND SEMICONDUCTOR DEVICE FABRICATED BY SUCH A METHOD

(75) Inventor: Hiroshi Fujikawa, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 377 days.

(21) Appl. No.: 09/634,951

(22) Filed: Aug. 7, 2000

(30) Foreign Application Priority Data

Feb. 18, 2000 (JP) .................................. 2000-041008

(51) Int. Cl.[7] .............................................. G06F 17/50
(52) U.S. Cl. ...................................................... 716/21
(58) Field of Search ........................ 716/19, 21; 430/5; 378/34, 35

(56) References Cited

U.S. PATENT DOCUMENTS

| | | | |
|---|---|---|---|
| 4,055,802 A | * 10/1977 | Panousis et al. | 714/736 |
| 5,103,557 A | * 4/1992 | Leedy | 29/407.01 |
| 5,302,491 A | * 4/1994 | Akylas et al. | 430/311 |
| 5,439,764 A | * 8/1995 | Alter et al. | 356/399 |
| 5,642,307 A | * 6/1997 | Jernigan | 235/375 |
| 5,654,588 A | * 8/1997 | Dasse et al. | 257/204 |
| 5,690,785 A | * 11/1997 | Nakaya | 216/59 |
| 5,990,540 A | * 11/1999 | Yokoya | 257/620 |
| 6,096,093 A | * 8/2000 | Caywood et al. | 716/19 |
| 6,238,824 B1 | * 5/2001 | Futrell et al. | 430/5 |
| 6,277,530 B1 | * 8/2001 | Yamada | 430/296 |
| 6,340,542 B1 | * 1/2002 | Inoue et al. | 430/5 |

FOREIGN PATENT DOCUMENTS

| | | |
|---|---|---|
| JP | 1-154510 | 6/1989 |
| JP | 6-84730 | 3/1994 |
| JP | 9-223723 | 8/1997 |

* cited by examiner

Primary Examiner—John F. Niebling
Assistant Examiner—Stacy Whitmore
(74) Attorney, Agent, or Firm—Burns, Doane, Swecker & Mathis, LLP

(57) ABSTRACT

A method of providing fabrication-historic data for a semiconductor device to a chip, has the step of: preparing a wafer with a pattern of a plurality of chips, where each chip has a product area to function as a semiconductor device and a fabrication-historical data area on which fabrication-historical data is to be held, wherein different fabrication-historical data is provided for each chip by exposing all of the chips on the wafer as a single unit by means of an exposure system using a mater mask while the product area of each chip is shielded from exposure or in one of the steps of forming the contact holes and carrying out wiring among the transistors. Consequently, the process can be easily performed because of the exposure in one operation using the master mask and thus the fabrication-historical data can be easily mounted on the chip.

4 Claims, 3 Drawing Sheets

METHOD OF MOUNTING FABRICATION-HISTORICAL DATA FOR SEMICONDUCTOR DEVICE, AND SEMICONDUCTOR DEVICE FABRICATED BY SUCH A METHOD

BACKGROUND OF THE INVENTION

1. Field of the Invention

The present invention relates to a method of mounting fabrication-historical data for a semiconductor device on each of chips formed on a wafer. The present invention also relates to a semiconductor device that is fabricated using such a method.

2. Description of Related Art

Conventionally, the technologies for individually mounting fabrication-historic data for a semiconductor device on respective chips formed on a wafer during the process of wafer processing have been known. For example, Japanese Patent Application Laying-open No. 6-84730/1994 discloses a method of fabricating a semiconductor device in which an additional memory area is formed on a semiconductor chip in the process of wafer-processing and individual data of the chip is written to such an area during the process of probe-examination before the process of dicing the wafer into chips. Such individual data is used for tracking down the cause of a failure and taking measures against such a failure at an early stage if the chip fails after the fabrication of the semiconductor device. In this case, the correspondence between the wafer-processing procedure and a defective condition of the chip is examined with reference to the fabrication-historical data stored in the failed chip.

In this case, however, all of the chips must be written on an individual basis so that is no effective procedure to easily mount the fabrica-historical data on the chip without taking much expense in time and effort.

SUMMARY OF THE INVENTION

The present invention is implemented to solve the foregoing programs. It is therefore an object of the present invention to provide a method for easily providing fabrication-historic data for a semiconductor device to each individual chip on a wafer and also to provide a semiconductor device to be fabricated by such a method.

According to a first aspect of the present invention, there is provided a method of providing fabrication-historic data for a semiconductor device to a chip, comprising the step of: preparing a wafer with a pattern of a plurality of chips, where each chip has a product area to function as a semiconductor device and a fabrication-historical data area on which fabrication-historical data is to be held, wherein different fabrication-historical data is provided for each chip by exposing all of the chips on the wafer as a single unit by means of the exposure system using a master mask.

Here, the method may further comprise the steps of: forming a gate electrode pattern for transistors on both product and fabrication-historical data areas in each of chips formed on the wafer by means an exposure system using a predetermined mask; forming holes for forming connections among the transistors on the product area and the fabrication-historical data area of each of the chips formed on the wafer by means of an exposure system using a predetermined mask; and carrying out wiring among the transistors by a conductive material using the holes, wherein different fabrication-historical data is provided for each chip by the exposure through master mask that provides a pattern for connecting the transistors on the fabrication-historical data area with each other in a different way for each chip to store the desired fabrication-historical data for each chip while the product area of each chip is blank-shot in at least one of the steps of forming the contact holes and carrying out wiring among the transistors.

The method may further comprises the steps of: forming a gate electrode pattern for transistors on the product area in each chip formed on the wafer by means an exposure system using a predetermined mask; forming holes for forming connections among the transistors on the product area of each of the chips formed on the wafer by means of an exposure system using a predetermined mask; and carrying out wiring among the transistors by a conductive material using the holes, wherein different fabrication-historical data is provided for each chip by the exposure through the master mask that provides a pattern for forming an identical mark that represents different fabrication-historical data for each chip to be physically distinguished while the product area of each of them is blank-shot in one of the steps of forming the holes and carrying out wiring among the transistors.

An identical mark may be any combination of characters and numerics.

According to a second aspect of the present invention, there is provided a method of providing fabrication-historic data for a semiconductor device to a chip, comprising the steps of: preparing a wafer with a pattern of a plurality of chips, where each chip has a product area to function as a semiconductor device and a fabrication-historical data area on which fabrication-historical data for the semiconductor device is to be held; forming a plurality of power pads to be connected to power supplies, a plurality of grounding pads to be connected to grounds, and intermediate pads which are not connected to both the power and grounding pads on the fabrication-historical data area using a predetermined mask; and forming electric conductors for connecting the power pads with the intermediate pads or connecting the grounding pads with the intermediate pads in a different way for each chip using a predetermined mask to store fabrication-historical data for each fabrication-historical data area in a plurality of the intermediate pads.

According to a third aspect of the present invention, there is provided a semiconductor device comprising a product area and a fabrication-historical data area, wherein the fabrication-historical data area has fabrication-historical data, which is provided by the method according to the first or second aspect of the present invention.

DETAILED DESCRIPTION OF THE PREFERRED EMBODIMENTS

Embodiments of the invention will now be described with reference to the accompanying drawings.

Embodiment 1

Figure 1:
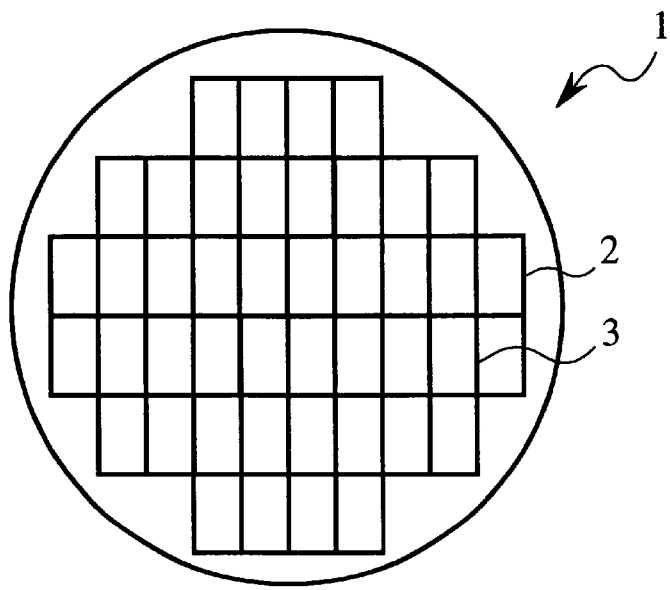
FIG. 1 is a plan view that illustrates a wafer to be used for fabricating a semiconductor device in accordance with the embodiment 1 of the present invention.

FIG. 1 is a plan view that illustrates a wafer to be used for fabricating a semiconductor device in accordance with an embodiment 1 of the present invention. In the figure, the reference numeral 1 denotes a wafer, 2 denotes a plurality of chips formed on the wafer 1, and 3 denotes dicing lines for cutting the wafer into the chips 2 at the process of assembly.

Figure 2:
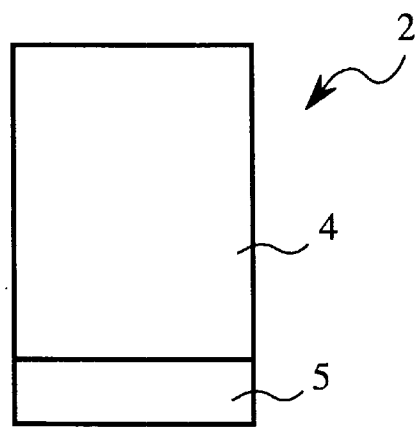
FIG. 2 is a magnified view of one of the chips 2 on the wafer shown in FIG. 1.

FIG. 2 is a magnified view of one of the chips 2 shown in FIG. 1. In the figure, the reference numeral 4 denotes a product area that performs the function of semiconductor device to be required in a final product, 5 denotes a fabrication-historical data area of the chip 2 that holds individual fabrication-historical data with reference to the process of fabricating a semiconductor device.

Figure 3:
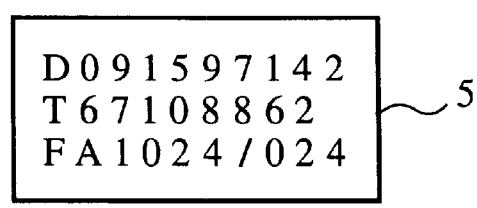
FIG. 3 is an explanatory that illustrates an example of the fabrication-historical data.

FIG. 3 is an explanatory that illustrates an example of the fabrication-historical data. For each of the chips 2, the fabrication-historical data may include the date and time of the fabrication, a lot number, a wafer number, and the location of the chip 2 on the wafer 1.

Figure 4:
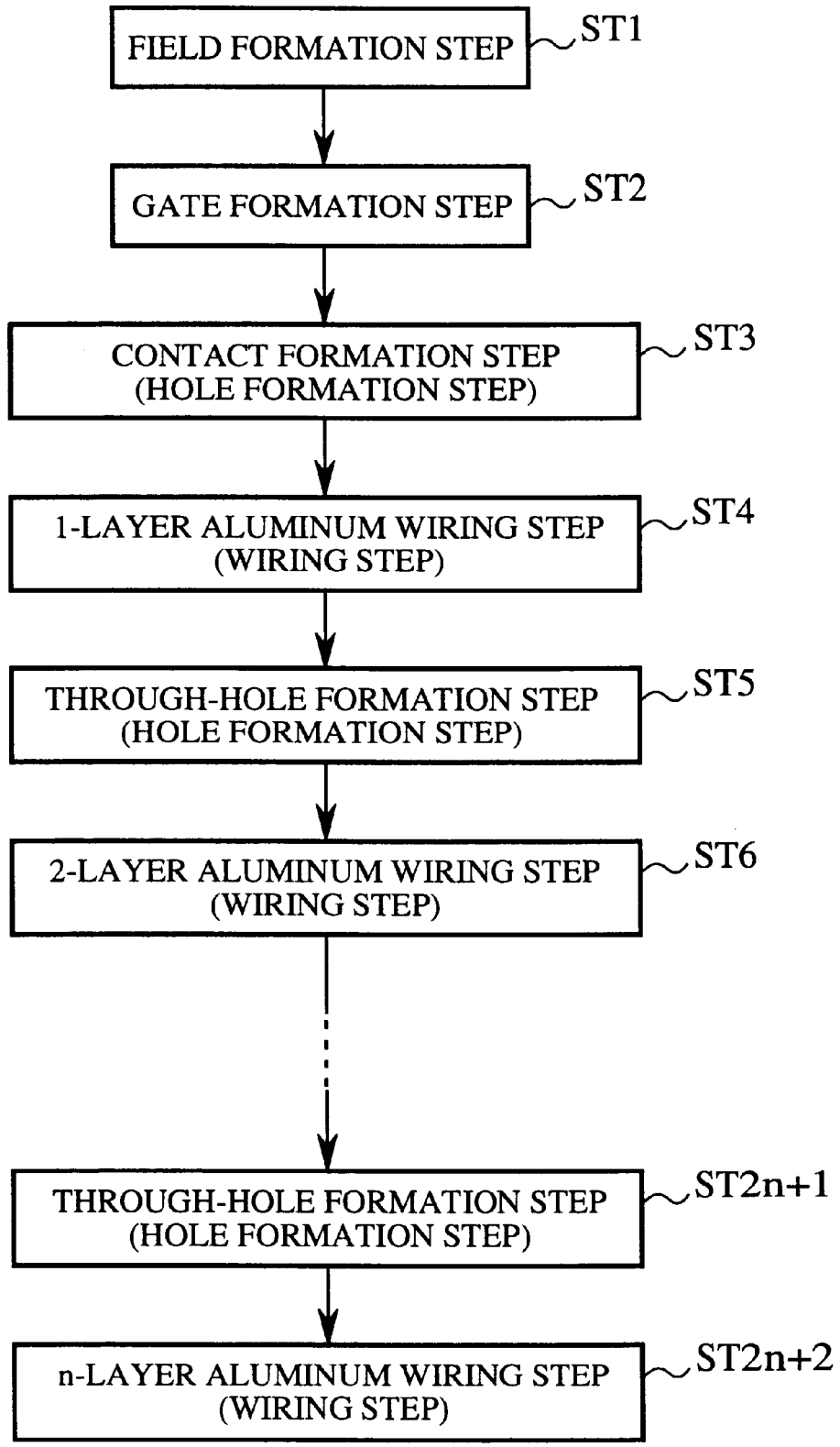
FIG. 4 is a flow chart that illustrates the method for mounting the fabrication-historical data of the semiconductor device according to the embodiment 1 of the present invention.

Furthermore, FIG. 4 is a flow chart that illustrates the method for mounting fabrication-historical data of a semiconductor device on a chip according to the embodiment 1 of the present invention.

Referring now to the drawings, the configuration of a chip 2 to be diced from a wafer 1 will be explained in the following description.

According to the embodiment 1, a chip 2 comprises a product area 4 and a fabrication-historical data area 5. A semiconductor device to be required in a final product is formed on the product area 4. On the other hand, fabrication-historical data with reference to each individual semiconductor device is mounted as a simplified read only memory (ROM) formed by the connections among transistors on the fabrication-historical area 4 of the chip 2.

The fabrication-historical data stored in the chips 2 can be provided for tracking down the cause of a failure and taking measures against such a failure at an early stage if the chip 2 fails after the fabrication of the semiconductor device. In this case, the correspondence between the wafer-processing procedure and a defective condition of the chip 2 is examined with reference to the fabrication-historical data stored in the failed chip 2.

Referring now to FIG. 4, a method for mounting the fabrication-historical data of the semiconductor device on a chip comprises the following steps.

(1) ST1: The Step of Forming a Field Oxide Film (i.e., a Transistor-isolation Oxide Film)

First, a wafer 1 is subjected to the step of coating a photoresist on the surface of the wafer 1. Then, a predetermined mask pattern of a mask is transferred to the wafer 1 to make the pattern of each of the chips 2 one after another by using a stepper (i.e., an exposure system such as a stepping projection aligner) so as to make the product and fabrication-historical data areas 4, 5 having the same patterns, respectively. Then, a field oxide film is formed using such a photoresist pattern as a mask. It is noted that a stepper is used in this embodiment, so that the mask pattern that comprises a pair of patterns for the product and fabrication-historical data areas 4, 5 can be exposed with a high degree of precision onto the wafer 1 to provide all of the chips 2 with the same pattern.

(2) ST2: The Step of Forming a Gate-electrode Pattern

Following the step ST1, the wafer 1 is subjected to the step of forming a gate-electrode pattern. In this step, a predetermined mask pattern of a mask for the gate-electrode is transferred to both the product and fabrication-historical data areas 4, 5 of each of the chips 2 one after another using the stepper. Thus, the gate electrodes for the transistors are formed so that al of the chips 2 have the same patterns as both the product and fabrication-historical data areas 4, 5.

As a result of performing the above steps (ST1 and ST2), the same transistor-gate electrode pattern is formed on the product area, 4 of each chip 2.

(3) ST3: The Step of Forming Contact Holes

Following the above steps ST1 and ST2, contact holes are formed as follows. First, the gate-electrode pattern is used as a mask to form a pair of source and drain regions, followed by subjecting to a vapor deposition to make an interlayer insulation film s(hereinafter, also referred to as an insulating layer). Then, contact holes for connecting between the transistors in each of the fabrication-historical data areas 5 are formed on the insulating layer by exposing all of the fabrication-historical data areas 5 of the chips 2 as a single unit using a master mask by an exposure system such as a mask aligner, where the product area 4 of each chip 2 is blank shot (i.e, a mask shields the product area from exposure during the exposure process). By the way, the photolithographic procedure using such a master mask is of only moderate accuracy. In this case, however, holes varied from one fabrication-historical data area 5 to another can be formed on the insulating layer by exposing all of the fabrication-historical data areas 5 as a single unit.

Therefore, if it is wished that a contact hole is formed using a different pattern thereof on each of the fabrication-historical data areas 5, each of the fabrication-historical data areas 5 should be exposed individually using one of different patterned masks when these masks are such as those used ST1 and ST2. In the step ST3, however, a master mask is used. Thus, the process is completed by only one exposure using a piece of master mask, resulting in a simplified procedure.

The reason for forming holes on the insulation layer of each fabric-historical area 5 by using a different patterned mask is that a simple ROM is formed on each of them to store a desired fabrication-historical data by forming an individual connection between transistors formed on each of the fabric-historical data area.

Subsequently, the contact holes for connecting between the transistors in each of the product areas 4 are formed on the insulating layer by exposing the product areas 4 of the chips 2 as a single unit by a stepper using a master mask to form the product areas 4 having the same patterns, while the fabrication-historical area 5 of each chip 2 is not subjected to the exposure.

In the step ST3, therefore, contact holes for connecting between transistors having the same pattern are formed on the insulation layers of the product areas 4, respectively. In addition, contact holes for connecting between transistors having the different patterns are formed on the insulation layers of the fabrication-historical areas 5, respectively.

(4) ST4: The Step of Forming a First Layer of Aluminum Wiring

An aluminum layer is deposited on the wafer by a spattering process and then subjected to the photolithograpy in which both the product and fabrication-historic data areas 4, 5 of each chip 2 are masked by a predetermined mask and exposed by a stepper to form single layered aluminum wiring using the contact holes formed on the insulation layer so as to form both the product fabrication-historical data areas 4, 5 having the same patterns, respectively.

(5) ST5: The Step of Forming Through-holes

Furthermore, through-holes are formed through the insulation layer having a first aluminum-wiring layer by subjecting to the photolithograpy in which both the product and fabrication-historic data areas 4, 5 of each chip 2 are masked by a predetermined mask and exposed by a stepper so as to form both the product and fabrication-historical data areas 4, 5 having the same patterns, respectively.

(6) ST6: The Step of Forming a Second Layer of Aluminum Wiring

An additional aluminum layer is deposited on the wafer by the sputtering process and then subjected to the photo-lithography in which both the product and fabrication-historic data areas 4, 5 of each chip 2 are masked by a predetermined mask and exposed by a stepper to form double layered aluminum wiring using the through-holes on the insulating layer so as to form both the product and the fabrication-historical data areas 4, 5 having the same patterns, respectively.

(7) ST2n+2: The Additional Steps of Forming Multiple Layer (n) of Aluminum Wiring Depending on the configuration of semiconductor device to be formed on each of the product area 4 and the configuration of simple ROM to be formed on each of the fabrication-historical data area 5, both the steps of forming through-holes and aluminum-wiring are repeated several times to form aluminum-wiring with the predetermined number (n) of layers (n: any natural number greater than three).

According to the embodiment 1, in the step of forming contact holes (ST3) as described above, all of the fabrication-historical data areas 5 of the chips 2 are exposed in one operation using the aligner or the like as the exposure system with the master mask so as to form holes for connecting between transistors in each of the fabrication-historical areas 5. Therefore, the embodiment 1 allows exposure to be performed in one operation using a piece of the master mask, so that the process can be simplified to facilitate the mounting of fabrication-historical data.

Following the step of forming the different pattern of holes for each fabrication historical data area 5, the connections between the transistors are performed on each of the fabrication-historic data areas 5 on an individual basis at the subsequent steps of forming first aluminum-wiring layer (ST4), through-holes (ST5), and second aluminum-wiring layer (ST6). Consequently, the desired fabric-historic data can be stored in a simple ROM for each of the fabrication-historic areas 5.

In the embodiment 1 described above, all of the fabrication-historical data areas 5 in the chips 2 is exposed as a single unit using the master disk in the step of forming contact holes (ST3). However, it is not limited to perform such an exposure in step ST3. It is also possible to perform the exposure on all of the fabrication-historical data areas 5 as a single unit using the master mask in any of the steps from ST3 (step of forming contact holes) to ST2n+2 (step of forming "n"-layered aluminum wiring). In any step using a master mask for exposing the fabrication-historical data areas 4 as a single unit, the product area 4 of each of the chips 2 can be exposed by a stepper using a mask with a blank shot of the fabrication-historical data area 5 in each chip 2.

Embodiment 2

In the embodiment 2, a product area 4 and a fabrication-historical data area 5 are formed on each chip 2 to be diced from a wafer 1. On the product area 4, a semiconductor device to be required as a product is formed. On the fabrication-historic data area 5, letters of alphabet or the like that represent the fabrication-historic data of the chip 2 in itself is formed so that the fabrication-historical data is physically identified.

A method of mounting the fabrication-historical data of the semiconductor device on the fabrication-historic data area 5 will described as follows with mainly reference to FIG. 4.

The method for mounting the fabrication-historical data of the semiconductor device comprises the following steps.

(1) ST1: The Step of Forming a Field Oxide Film (i.e., a Transistor-isolation Film)

First, a wafer 1 is subjected to the step of forming a photoresist on the surface of the wafer 1. Then, a predetermined mask pattern of a mask is transferred to the wafer 1 to each of the chips 2 one after another by using a stepper (i.e., an exposure system such as a stepping projection aligner) so as to make the same photoresist pattern of the product areas 4 on all of the chips 2 while the areas to be formed as fabrication-historical data areas 5 are blank-shot, followed by forming a field oxide film using such photoresist patterns as a mask.

(2) ST2: The Step of Forming a Gate-electrode Pattern

Following the step ST1, the wafer 1 is subjected to the step of forming a gate-electrode pattern. In this step, a predetermined mask pattern of a mask for the gate-electrode is transferred to the product area 4 of each of the chips 2 one after another using the stepper, while the fabrication-historical data area 4 thereof is blank shot. Thus, all of the chips 2 have the same pattern of the product areas 4.

Therefore, the above steps ST1 and ST2 allow the formation of the same pattern of transistor-gate electrode on each chip 2 having a pair of a product area 4 and a fabrication-historical data area 5.

(3) ST3: The Step of Forming Contact Holes

Following the above steps ST1 and ST2, contact holes are formed as follows. First, the gate-electrode pattern is used as a mask to form a pair of source and drain regions, followed by subjecting to a vapor deposition to make an interlayer insulation film (an insulating layer). Then, contact holes for connecting between the transistors in each of the fabrication-historical data areas 5 are formed on the insulating layer by exposing the fabrication-historical data areas 5 of the chips 2 as a single unit using a master mask by a mask aligner or the like, while the product area 4 of each chip 2 is blank-shot. By the way, the photolithographic procedure using such a master mask is of only moderate accuracy. In this case, however, holes varied from one fabrication-historical data area 5 to another can be formed on the insulating layer by exposing all of the fabrication-historical data areas 5 as a single unit.

Therefore, if it is wished that a contact hole is formed using a different pattern thereof on each of the fabrication-historical data areas 5, each of the fabrication-historical data areas 5 should be exposed individually using one of different patterned masks when these masks are such as those used ST1 and ST2. In the step ST3, however, a master mask is used. Thus, the process is completed by only one exposure using a piece of master mask, resulting in a simplified step.

The reason for forming the contact holes on the insulation layer of each fabric-historical area 5 by using a different patterned mask is to form the different pattern of desired fabrication-historic data to be physically distinguished from on each of the fabrication-historic data areas 5. Concretely, one set of letters shown in FIG. 3 may be formed on one of the fabrication-historic data areas 5, as it is.

Then, contact holes for connecting between the transistors in each of the product areas 4 are formed so as to make the identically patterned product areas 4 by exposing product area 4 using a stepper through a mask, while the fabrication-historical area 5 of each chip 2 is blank-shot.

In the step ST3, therefore, the identical contact holes for connecting between the transistors are formed on the insulation layer, while the different fabric-historical data is formed as a different set of letters on the insulation layer for each of the fabrication-historical areas 5.

(4) ST4: The Step of Forming a First Layer of Aluminum Wiring

An aluminum layer is deposited on the wafer by a spattering process and then subjected to the photolithograpy in which the product and area 4 of each chip 2 is masked by a predetermined mask and exposed by a stepper while the fabrication-historical data area 5 is blank shot so as to form single layered aluminum wiring using the contact holes on the insulation layer, resulting in the product areas 5 having the same pattern.

(5) ST5: The Step of Forming Through-holes

Furthermore, through-holes are formed through the insulation layer having a first aluminum-wiring layer by subjecting to the photolithograpy in which the product area 4 of each chip 2 is masked by a predetermined mask and exposed by a stepper while the fabrication-historical data area 5 is blank shot so as to form the product areas 4 of all of the chips 2 having the same pattern.

(6) ST6: The Step of Forming a Second Layer of Aluminum Wiring

An additional aluminum layer is deposited on the wafer by the spattering process and then subjected to the photolithograpy in which the product area 4 of each chip 2 is masked by a predetermined mask and exposed by a stepper while the fabrication-historical data area 5 is blank shot so as to form double layered aluminum wiring using the through-holes on the insulation layer, resulting in the product areas 4 of all of the chips 2 having the same pattern.

(7) ST2n+2: The Additional Steps of Forming Multiple Layer (n) of Aluminum Wiring Depending on the configuration of semiconductor device to be formed on each of the product area 4, both the steps of forming through-hole and aluminum-during are repeated several times to form aluminum-wiring with a predetermined number (n) of layers (n: any natural number greater than three.

According to the embodiment 2, as described above, all of the fabrication-historical data areas 5 of the chips 2 are exposed in one operation using an aligner or the like with the master mask so as to form holes on the insulating layer in each of the fabrication-historical areas 5. Therefore, the embodiment 2 allows the exposure in one operation using a piece of the master mask, so that the process can be simplified to facilitate the mounting of fabrication-historical data.

By the step of forming a different pattern of contact holes for each of fabrication-historical data area 5, the desired fabric-historic data to be physically distinguished can be formed on each fabrication-historical data area 5.

In the embodiment 2 described above, all of the fabrication-historical data areas 5 in the chips 2 is exposed as a single unit by the aligner or the like using the master disk in the step of forming contact holes (ST3). Thus, the process is completed by only one exposure using a piece of master mask, resulting in a simplified procedure.

Furthermore, the desired fabrication-historical data to be physically distinguished can be formed on each fabrication-historical data area 5 by forming different patterned holes on the insulating layer for each fabrication-historical data area 5.

In the embodiment 2 described above, all of the fabrication-historical data areas 5 in the chips 2 is exposed as a single unit using the master disk in the step of forming contact holes (ST3). However, the invention is not limited to perform such an exposure in step ST3. It is also possible to performing the exposure on all of the fabrication-historical data areas 5 as a single unit using the master desk in any of the steps, for example from ST3 (step of forming contact holes) to ST2n+2 (step of forming "n"-layered aluminum wiring). In case of the step of aluminum wiring, the desired fabrication-historical data to be physically distinguished can be formed on the fabrication-historical area 5 by means of aluminum wiring. In the step of using a master disk for the exposure exposing as a single unit, the product area 4 of each of the chips 2 can be exposed by the stepper using a mask with a blank shot of the fabrication-historical data area 5.

Embodiment 3

Figure 5:
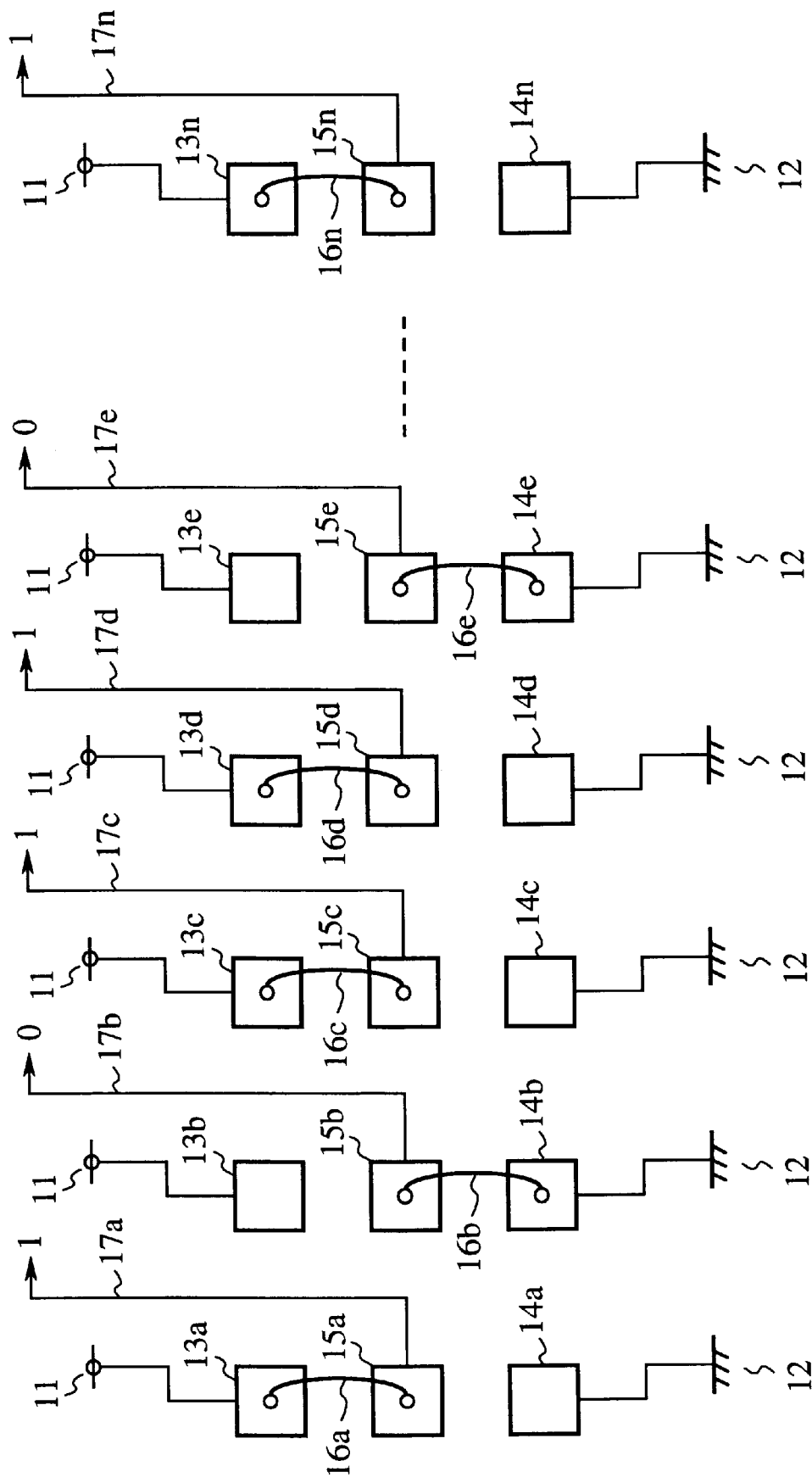
FIG. 5 is a wiring diagram that illustrates a fabrication-historical area of the chip in accordance with the embodiment 3.

FIG. 5 is a wiring diagram that illustrates a fabrication-historical area of the chip in accordance with the embodiment 3. The reference numeral 11 denotes an electric power supply, 12 denotes a ground, 13a–13n ("n" is any natural number) denote power pads which are connected to their respective power supplies 11, 14a–14n denote grounded pads which are connected to their respective grounds 13a–13n, and 15a–15n denote intermediate pads which are not connected to the electric power supply 11 and the ground 12. The reference numerals 16a–16n denote electric conductors to make connections between the power pads 13a–13n and the intermediate pads 15a–5n or make connections between the ground pads 14a–4n and the intermediate pads 15a–5n. The reference numerals 17a–17n denote electric-wire which are connected to their respective intermediate pads 15a–5n.

Next, the operation of the embodiment 3 will be described as follows.

According to the embodiment 3, a chip 2 comprises a product area 4 and a fabrication-historical information area 5. A semiconductor device to be required in a final product is formed on the product area 4. On the other hand, historical data with reference to the process of fabricating the chip 2 is mounted on the fabrication-historical data area 5 by connecting the intermediate pads 15a–5n with the power pads 13a–3a or connecting the grounded pads 14a–14n with the electric conductors 16a–16n.

Referring again to FIG. 5, a method for mounting the fabrication-historical data of the semiconductor device comprises the following steps.

(1) The Step of Forming a Plurality of Chips 2 on a Wafer 1

First, a wafer 1 is subjected to the step of photolithography to form fa plurality of chips 2 on the wafer 1. Each of the chips 2 has a product area 4 and a fabrication-historical data area 5.

(2) The Step of Forming Pads on the Fabrication-historical Data Area 5 of Each Chip 2

On the fabrication-historical data are 5 of each of the chips 2 formed on the wafer 5, a plurality of power pads 13a–3n to be connected with the electric power supplies 11, a plurality of grounded pads 14a–4d to be connected with grounds 12, a plurality of intermediate pads 15a–5n which are not connected to the electric power supplies 11 and the grounds 12, and electric wires 17a–7n to be connected with the intermediate pads 15a–5n are formed.

(3) The Step of Forming Electric Conductor Connections

The electric conductors 16a–6n connect the power pads 13a–3n with the intermediate pads 15a–5n or the grounded pads 14a–4n with the intermediate pads 15a–5n so as to store the desired fabrication-historical data in a plurality of intermediate pads for each fabrication-historical data area 5 of each chip 2.

As shown in FIG. 5, for example, the above steps permit the storage of fabrication-historical data "10110 . . . 1" in the intermediate pads 15a–5n by the connecting patterns of the electric conductors 16a–16n. The fabrication-historical data can be read from the intermediate pads 15a–5n through the electric wires 17a–7n.

According to the embodiment 3, as described above, the process comprises the steps of forming power pads 13a–4n, grounded pads 14a–4n, and intermediate pads 15a–5n on a fabrication-historical data area 5 of each of the chips 2; and selectively making connections between the power pads 13a–3n and the intermediate pads 15a–5n or connections between the grounded pads 14a–4n and the intermediate pads 15a–5n through electric conductors 16a–16n so as to store the desired fabrication-historical data in the fabrication-historical data area 5 of each chip 2. Therefore, the configuration of the semiconductor device can be simplified and the method of mounting fabrication-historical data for the semiconductor device can be simplified and easily performed.

In the step of aluminum wiring in accordance with the embodiment 2 shown in FIG. 4, the steps of forming pads and the electric conductor connections in accordance with the embodiment 3 may be performed to form all of the fabrication-historical data area 5 of the respective chips 2 in one operation using the aligner through a master mask so as to form each paid in fabrication-historical data area 5 by aluminum wiring. Therefore, the embodiment 3 also allows the formation of different pads by performing the exposure in one operation using a piece of master mask, so that the process can be simplified to facilitate the mounting of fabrication-historical data.

In the embodiment 3, furthermore, the fabrication-historic data may be directly read from the intermediate pads 15a–5b in stead of reading from the electric wires 17a–7n. In this case, therefore, there is no need to form electric wires 17a–7n.

As described above, the present invention is configured such that the method comprises the step of preparing a wafer with a pattern of a plurality of chips, where each chip has a product area to function as a semiconductor device and a fabrication-historical data area on which fabrication-historical data is to be held, wherein different fabrication-historical data is provided for each chip by exposing all of the chips on the wafer as a single unit by means of the exposure system using a master mask. This offers an advantage of being able to perform the exposure in one operation using a piece of the master desk, so that the process can be simplified to facilitate the mounting of fabrication-historical data on each of the chips.

The present invention is configured such that the master mask provides a pattern for individually connecting the transistors on the fabrication-historical data area for each chip to hold the desired fabrication-historical data for each chip or a pattern for forming an identical mark that represent s different fabrication-historical data for each chip to be physically distinguished. This offers an advantage of being able to mount the fabrication-historical data on each chip by means of simple ROM or physically distinguishable mark such as any combination of characters and numerics.

The present invention is configured such that the method comprises the steps of: forming a plurality of power pads to be connected to power supplies, a plurality of grounding pads to be connected to grounds, and intermediate pads which are not connected to both the power and grounding pads on the fabrication-historical data area; and forming electric conductors for connecting the power pads with the intermediate pads or connecting the grounding pads with the intermediate pads in a different way for each chip to store fabrication-historical data for each fabrication-historical data area in a plurality of the intermediate pads. This offers an advantage of being able to simplify the configuration of a semiconductor device and the process of fabricating such a device and to facilitate the mounting of fabrication-historical data for the semiconductor on each of the chips.

The present invention is configured such that the semiconductor device comprises a product area and a fabrication-historical data area, wherein the fabrication-historical data area has fabrication-historical data, which is provided by the method according to the first or second aspect of the present invention. This offers an advantage of being able to perform the exposure in one operation using a piece of the master mask, so that the process can be simplified to facilitate the mounting of fabrication-historical data on each of the chips.

What is claimed is:

1. A method of providing fabrication-historic data for a semiconductor device to a chip, comprising the step of:

preparing a wafer with a pattern of a plurality of chips, where each chip has a product area to function as a semiconductor device and a fabrication-historical data area on which fabrication-historical data is to be held, wherein said product area is provided for each chip individually by exposing the product area to a mask designed to expose one chip at a time, and different fabrication-historical data is provided for each chip by exposing all of the chips on the wafer as a single unit by means of the exposure system using a master mask.

2. A method as claimed in claim 1, further comprising the steps of:

forming a gate electrode pattern for transistors on both the product and fabrication-historical data areas in each chip formed on the wafer by means an exposure system using a predetermined mask;

forming holes for forming connections among the transistors on both the product and fabrication-historical data areas of each of the chips formed on the wafer by means of an exposure system using a predetermined mask; and carrying out wiring among the transistors by a conductive material using the holes by means of an exposure system using a predetermined mask, wherein different fabrication-historical data is provided for each chip by the exposure through the master mask that provides a pattern for connecting the transistors on the fabrication-historical data area with each other in a different way for each chip to store the desired fabrication-historical data for each chip while the product area of each chip is shielded from exposure in at least one of the steps of forming the holes and carrying out the wiring among the transistors.

3. A method as claimed in claim 1, further comprising the steps of:

forming a gate electrode pattern for transistors on the product area in each chip formed on the wafer by means an exposure system using a predetermined mask;

forming holes for forming connections among the transistors on the product area of each of the chips formed on the wafer by means of an exposure system using a predetermined mask; and carrying out wiring among the transistors by a conductive material using the holes, wherein different fabrication-historical data is provided for each chip by the exposure through the mater mask that provides a pattern for forming a identical mark that represent s different fabrication-historical data for each chip to be physically distinguished while the product area of each chip is shielded from exposure in at least one of the steps of forming the contact holes and carrying out wiring among the transistors.

4. A method as claimed in claim 3, wherein the identical mark is any combination of characters and numerics.

* * * * *